(12) United States Patent
Moore (10) Patent No.: US 7,449,754 B2
(45) Date of Patent: Nov. 11, 2008

(54) SINGLE POLY BICMOS FLASH CELL WITH FLOATING BODY

(75) Inventor: Paul M. Moore, Foster City, CA (US)

(73) Assignee: Micrel, Incorporated, San Jose, CA (US)

( * ) Notice: Subject to any disclaimer, the term of this patent is extended or adjusted under 35 U.S.C. 154(b) by 57 days.

(21) Appl. No.: 11/278,753

(22) Filed: Apr. 5, 2006

(65) Prior Publication Data
US 2007/0235816 A1    Oct. 11, 2007

(51) Int. Cl.
*H01L 27/00* (2006.01)
(52) U.S. Cl. .............................. 257/370; 257/E27.015
(58) Field of Classification Search ................. 257/370, 257/E27.015, E27.03, E27.109
See application file for complete search history.

(56) References Cited

U.S. PATENT DOCUMENTS 5,248,624 A * 9/1993 Icel et al. ................... 438/201
5,838,048 A * 11/1998 Hirai et al. .................. 257/378

* cited by examiner

*Primary Examiner*—Lex Malsawma
(74) *Attorney, Agent, or Firm*—Bever, Hoffman & Harms, LLP; Patrick T. Bever

(57) ABSTRACT

A BiCMOS integrated circuit (IC) includes a floating gate-type non-volatile memory (NVM) device that uses the polycrystalline silicon gate of a CMOS FET and the P-base and N-emitter diffusions of a bipolar transistor to provide an isolated P-type body and N-type source/drain diffusions. The P-body diffusion of the NVM device is isolated from a P-substrate by an N-well, thus facilitating the use of reduced positive and negative voltage levels to produce the onset of Fowler-Nordheim tunneling without the need for a triple-well structure. The polysilicon gate structure is formed on a suitable gate oxide over the P-body. The source/drain diffusions, which like the N-emitter diffusions of the bipolar transistor have no LDD, produce a reduced field drop across the gate oxide to allow Fowler-Nordheim tunneling from the source side.

13 Claims, 6 Drawing Sheets

SINGLE POLY BICMOS FLASH CELL WITH FLOATING BODY

FIELD OF THE INVENTION

This invention relates to memory cells, and more particularly to nonvolatile memory cells produced using a BiCMOS fabrication process.

BACKGROUND OF THE INVENTION

Using early integrated circuit (IC) fabrication techniques, integrating both bipolar and MOS transistors into a single IC device was difficult and uneconomical. For this reason, depending upon the function to be performed, most early ICs included either bipolar transistors fabricated using a bipolar process flow, or MOS transistors fabricated using, for example, a complementary metal-oxide-semiconductor (CMOS) process flow. CMOS is currently the dominant IC fabrication technology for most common types of ICs.

Integrated bipolar and complementary metal-oxide-semiconductor (BiCMOS) fabrication techniques were introduced in the late 1990s to facilitate the efficient production of IC devices that include both bipolar and MOS transistors formed on the same semiconductor substrate. The advantage of BiCMOS devices is that they combine the high power and fast switching speeds of bipolar devices with the high density and low power consumption of MOS transistors, which provides the advantages of noise immunity, linearity, device matching, and high drive capacity, thus permitting performance optimization and a higher degree of system integration. A disadvantage of BiCMOS devices is that, because BiCMOS is not as well developed as CMOS and bipolar techniques, BiCMOS feature sizes are generally larger than those achievable using CMOS and bipolar fabrication techniques, and individual device performance is typically slower.

Like bipolar and CMOS fabrication techniques, BiCMOS process flows include hundreds of complex and mutually interdependent processing steps that must be performed in a well-defined sequence in order to build BiCMOS circuits successfully. These steps, as well as their sequence, must be carefully planned to assure high yield, adequate performance, and acceptable cost.

Some IC designs require the inclusion of non-conforming circuit structures (i.e., circuit structures that cannot be produced using the established process flow). When this occurs, it is necessary to add masks and/or process steps to the existing process flow, which at a minimum increases processing time and cost, and in the worst case requires substantial "tweaking" of the modified process flow in order to produce acceptable yields.

As example of a possible non-conforming circuit structure is a non-volatile memory cell. Non-volatile memory (e.g., Erasable Programmable Read-Only Memory (EPROM), Electrically Erasable Programmable Read-Only Memory (EEPROM), and flash memory), unlike volatile memory (e.g., read-only memory (RAM)), is capable of preserving information without a power supply. The information is preserved on a floating gate (i.e., a doped polycrystalline silicon structure that is entirely surrounded by insulation), and floating gate is erased (i.e., charged added to or drawn from) or programmed (i.e., drawn from or added to) by creating a suitable potential between the floating gate and an adjacent conductor that is high enough to cause injection or tunneling of electrons through the insulation layer. Because non-volatile memory is able to retain data when power is lost, demand for non-volatile memory has increased along with the rise in usage of battery-powered portable electronic devices, such as cellular phones, MP3 players, and digital cameras.

In the field of non-volatile memories there is an advantage to isolate the P-body of an N-channel Flash cell. The advantage provided by isolating the P-body is that this isolation reduces the level of voltage required to pump from the standard supply voltages to achieve a minimum electric field of 10 Mv/cm, which is the minimum required to produce the onset of Fowler-Nordheim tunneling. By having an isolated P-body one can bias the P-body and the control gate to achieve 10 Mv/cm across the body and floating-gate, thereby reducing the burden of the charge pump. For example, one could bias the control-gate to −6V and the P-body to 6V to achieve 12 MV/cm on a 100 Angstrom gate oxide (assuming a coupling ratio of one). In contrast, when the body is not isolated, one would need to pump the voltage to −12 V on the control-gate or 12V on the source, which creates the further burden of providing a high voltage source.

Traditionally, an isolated P-body is accomplished by a complicated triple well process that is not part of a standard CMOS process flow. Because triple-wells cannot be formed by typical CMOS process flows, the selected CMOS flow must be modified to include additional masks and processing steps, which increases overall production costs and typically reduces production yields.

Similar to CMOS process flows, non-volatile memory cells are considered non-conforming in conventional BiCMOS process flows.

What is needed is a non-volatile memory cell and method for forming such a cell using a BiCMOS process flow in a manner that minimizes the number of additional masks and/or process steps.

SUMMARY OF THE INVENTION

The present invention utilizes the various diffusions and structures normally included in a standard Bi-CMOS process flow to produce a floating gate-type non-volatile memory (NVM) device that provides an isolated body without the triple-well arrangement required in CMOS processing. In particular, the NVM device of the present invention combines the bipolar P-type base and "ZN+" (i.e., no-LDD) emitter diffusions of the BiCMOS process flow with the CMOS FET N-well diffusion and polysilicon gate structure of the BiCMOS process flow. The P-base diffusion of the NVM device, which typically has a doping concentration that is ten times higher than the surrounding N-well, is isolated from the P-substrate by the N-well, thus facilitating the use of reduced positive and negative voltage levels to produce the onset of Fowler-Nordheim tunneling between the P-base diffusion and the control gate without the need for a triple-well structure. The polysilicon gate structure is formed on a suitable gate oxide over the P-base diffusion, and ZN+ source/drain diffusions are formed in the P-base on opposite sides of the polysilicon gate. The ZN+ source/drain diffusions include a relatively high, uniform dopant concentration that extends to the edge of or under the control gate (i.e., LDD regions are not included) to limit the field drop across the gate oxide, which facilitates Fowler Nordheim tunneling between the source/drain diffusions and the control gate. Because the N-well and P-base diffusions, polysilicon gate structure, and ZN+ source/drain diffusion are typically sequentially respectively formed in a standard BiCMOS process flow (i.e., no additional masks or process steps are required), the present invention provides a "no-cost" NVM that can be produced using a standard BiCMOS flow.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improved NVM device formed using standard BiCMOS fabrication techniques. The following description is presented to enable one of ordinary skill in the art to make and use the invention as provided in the context of a particular application and its requirements. As used herein, directional terms such as "upper", "above", "lower", and "below", are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
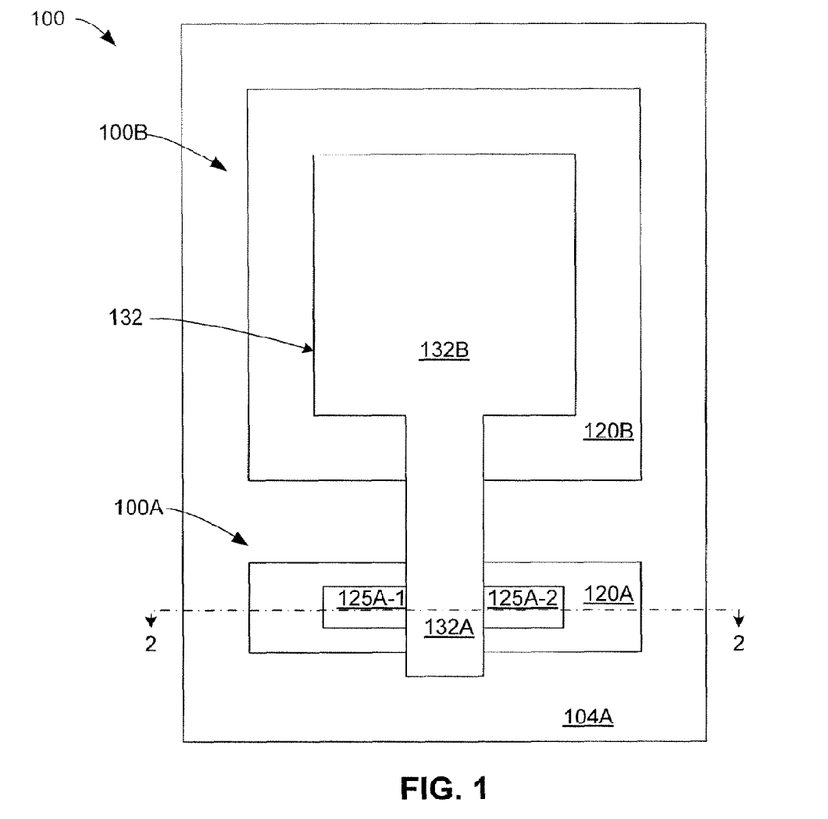
FIG. 1 is a plan view showing diffusion regions and structures associated with a NVM device according to an embodiment of the present invention.

FIG. 1 is a plan view depicting a portion of a BiCMOS IC 100 (i.e., an IC formed using BiCMOS fabrication techniques) in accordance with an embodiment of the invention. In particular, FIG. 1 shows a portion of BiCMOS IC 100 including an NVM FET-type device 100A and an associated coupling capacitor 100A. NVM device 100A is also described in conjunction with FIG. 2, which illustrates a cross-section of NVM device 100A taken along section line 2-2 in FIG. 1. The present invention is primarily directed to floating gate transistor portion 100A. Coupling capacitor 100B, which is primarily utilized during program/erase functions, is described in additional detail in co-owned and co-pending U.S. patent application Ser. No. 11/351,520, entitled "NON-VOLATILE MEMORY CELLS AND METHODS FOR FABRICATING THE SAME", which is incorporated herein by reference in its entirety.

Figure 2:
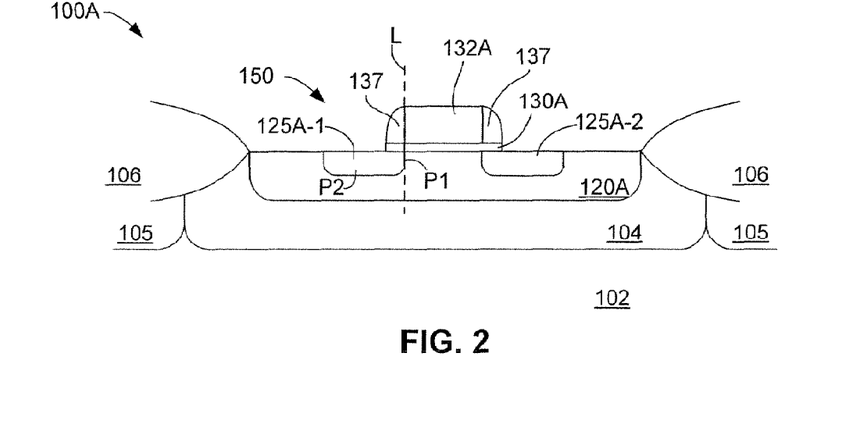
FIG. 2 is cross-sectional side view showing a portion of the NVM device of FIG. 1.

Referring to FIGS. 1 and 2, NVM device 100A and coupling capacitor 100B are disposed in an N-well region 104A, which as shown in FIG. 2 is a diffusion region formed in a P-substrate 102 that includes one or more additional N-well regions (not shown) and one or more P-well regions 105. P-base diffusion regions 120A and 120B are formed in N-well region 104A such that they are electrically isolated. A suitable insulation or dielectric structure (e.g., gate oxide 130A) is formed on a surface of substrate 102, and a single (integral) conductive structure 132 (e.g., doped polycrystalline silicon, referred to as "polysilicon" herein) is disposed on this insulation/dielectric layer such that a floating control gate portion 132A of polysilicon structure 132 is disposed over P-base diffusion region 120A, and a capacitor plate portion 120B is disposed over diffusion region 120B. Source/drain regions 125A-1 and 125A-2 are disposed in P-base region 120A on opposite sides of floating gate portion 132A. In accordance with standard BiCMOS fabrication techniques, P-base regions 120A and 120B are more heavily doped (i.e., have a higher doping concentration) than N-well 104A and P-wells 105, and source/drain regions 125A-1 and 125A-2 are more heavily doped than P-base region 120A. Although NVM device 100A and coupling capacitor 100B are both disposed in N-well region 104A and share polysilicon structure 132 in the embodiment of FIG. 1, these devices may be disposed in separate N-wells and include separate polysilicon structures that are linked, for example, by a metallization structure formed in accordance with known techniques.

An advantage provided by NVM device 100A is P-base region 120A provides a body region that is isolated from P-substrate 102 by N-well 104A, thus reducing the level of voltage required to pump from the standard supply voltages to achieve a minimum electric field of 10 Mv/cm, the onset of Fowler-Nordheim tunneling. By disposing P-body region 120A inside N-well 104A, one can bias P-body region 120A and control gate 132A to achieve 10 Mv/cm across P-body and floating-gate and reduce the burden of the charge pump. For example, one could bias the control-gate to −6 V and the body to 6V to achieve 12 MV/cm on a 100 Angstrom gate oxide (assuming a coupling ratio of 1). Alternatively one would need to pump the voltage to −12 V on the control-gate or 12 V on the source (not having an isolated body), which would create the burden of providing BiCMOS IC 100 with a high voltage source.

Another advantage provided by NVM device 100A is that P-base body region 120A is isolated from P-substrate 102 without the need for the complicated triple-well arrangement that is typically required in CMOS fabrication techniques. In accordance with an aspect of the present invention, the body of NVM device 100A is formed using the body region 120A, which is fabricated using the mask and process steps associated with the fabrication of bodies for NPN-type bipolar transistors. Because N-well 104A and P base body region 120A are typically sequentially respectively formed in a standard BiCMOS process flow (i.e., no additional masks or process steps are required), the formation of "isolated" body region 120A can be performed without changing the standard BiCMOS flow.

Another advantage provided by NVM device 100A is that gate oxide 130A and polysilicon control gate 132A are identical to, and therefore can be simultaneously formed with, the gate oxide and polysilicon gate structures associated with CMOS FET transistors that are fabricated by the BiCMOS process flow, thereby facilitating the formation of polysilicon control gate 132A without changing the standard BiCMOS flow.

In accordance with an aspect of the present invention, source/drain regions 125A-1 and 125A-2 are formed using the "ZN+" processing mask and doping sequence utilized to produce an N-type emitter (N-emitter) of an NPN bipolar transistor using the selected BiCMOS process. In particular, as indicated in FIG. 2, source/drain regions 125A-1 and 125A-2 are formed without lightly-doped drain (LDD) regions such that the N-type doping concentration of source/ drain regions 125A-1 and 125A-2 remains substantially uniform (i.e., the doping concentration at a portion P1 of source/drain region 125A-1 located under a side edge of control gate structure 132A (e.g., as indicated by vertical line L in FIG. 2) is substantially the same as a portion P2 located away from control gate 132). That is, unlike typical CMOS FET devices that include LDD regions extending between relatively heavily-doped (e.g., N+) regions toward the polysilicon gate, source/drain regions 125A-1 and 125A-2 include relatively heavily-doped "ZN+" (e.g., Arsenic only) diffusion regions that extend under the side edge of control gate 132A. The present inventors determined that this "ZN+" source/drain arrangement produces a more efficient NVM device because the LDD arrangement used in conventional CMOS devices restricts the flow of hot carriers. That is, when LDD structures are used to form NVM devices, the resulting field drop was found to be too high across the LDD region to produce a high enough field across the gate oxide to facilitate Fowler-Nordheim tunneling to erase from the source side of the NVM device.

Referring again to FIG. 2, polycrystalline control gate structure 132A includes optional sidewall spacer (oxide) structures 137 that are formed using conventional techniques. Sidewall spacer structures 137 are often used in the production of CMOS FFT transistors to self-align the heavily-doped N+ source/drain regions with the LDD regions. Note that because NVM device 100A does not include LDD regions, sidewall spacer structures 137 may be omitted (i.e., because source/drain regions 125A-1 and 125A-2 are self-aligned to control gate 132A). However, because omission would require an unnecessary modification to the standard BiCMOS process flow, sidewall spacer structures 137 are preferably included in NVM device 100A.

Figure 3:
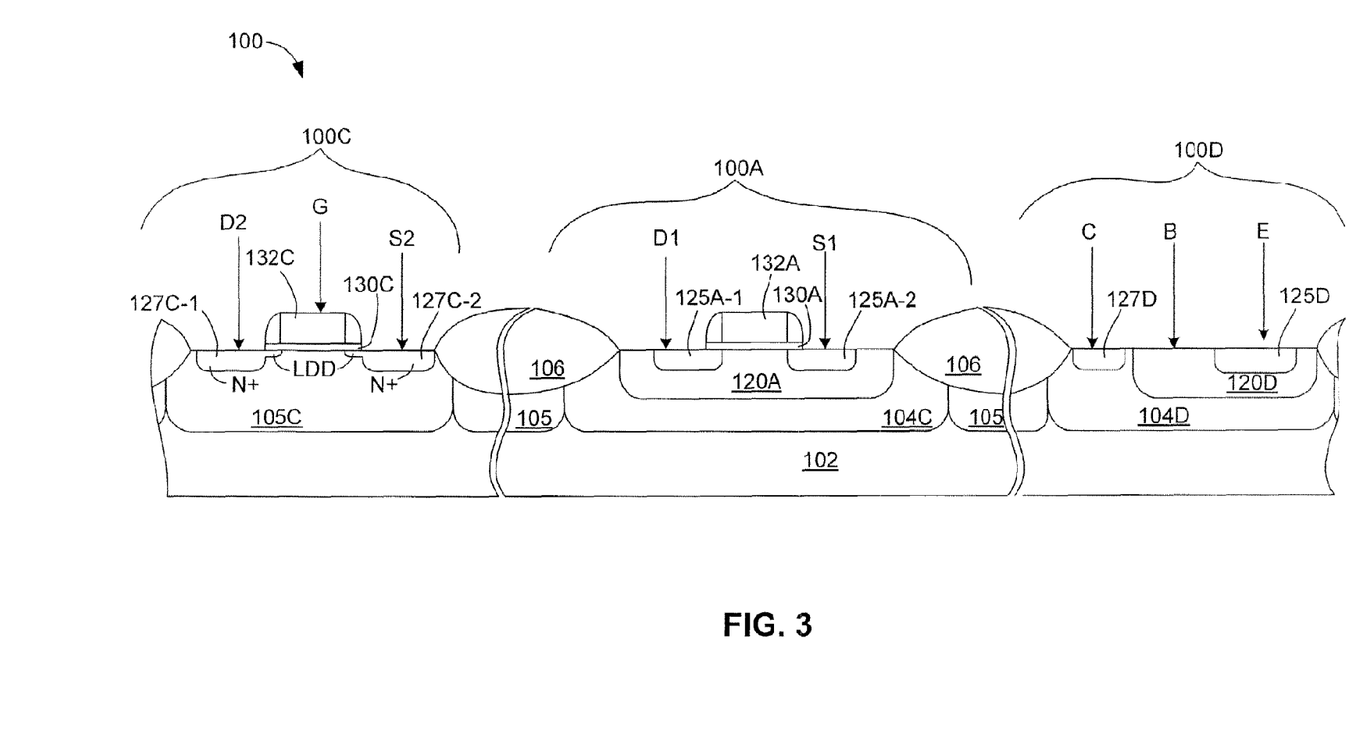
FIG. 3 is a cross-sectional side view showing a portion of a BiCMOS IC including the NVM device of FIG. 1 along with a CMOS device and a bipolar device that are simultaneously fabricated with the NVM device.

FIG. 3 shows BiCMOS IC 100 in additional detail. According to an embodiment of the present invention, NVM device 100A is fabricated simultaneously with other devices on substrate 102. In particular, as mentioned above, selected portions of NVM device 100A are fabricated simultaneously with an N-channel CMOS FET transistor 100C, and other portions of NVM device 100A are fabricated simultaneously with an NPN bipolar transistor 100D, with all three device types being simultaneously fabricated using the BiCMOS process flow in the manner described below. Note that PNP bipolar transistors and N-channel CMOS FETs, which are also typically fabricated during a typical BiCMOS process flow, are omitted from the following discussion for brevity.

Referring to the right side of FIG. 3, CMOS FET 100C is formed in a P-well region 105C, and includes a gate dielectric 130C and a control gate 132C disposed on the second gate dielectric. Note that gate dielectric 130C and a control gate 132C are substantially identical in thickness and electrical characteristics to gate dielectric 130A and control gate 132A of NVM device 100A. N-type source and drain regions 127C-1 and 127C-2 are disposed in P-well 105C on opposite sides of control gate 132C. Unlike source/drain regions 125A-1 and 125A-2, each of source and drain regions 127C-1 and 127C-2 have doping concentrations that vary from lightly-doped drain (LDD) regions located adjacent to control gate 132C, to heavily-doped (N+) regions located away from control gate 132C. In one embodiment, the heavily-doped (N+) regions of N-type source and drain regions 127C-1 and 127C-2 have doping concentrations that are higher than the doping concentrations of source/drain regions 125A-1 and 125A-2. The inventors found source/drain regions 125A-1 and 125A-2 were less leaky to body 120A when their doping concentration was lower than the doping concentration provided in source/drain regions 127C-1 and 127-C2. However, the inventors recognize that the perceived leakage reduction could be due to the applied annealing process, and therefore recognize that the doping concentrations of As in source/drain regions 125A-1 and 125A-2 may be equal to or even greater than the As doping concentrations in source/drain regions 127C-1 and 127C-2. Similarly, N+ collector contact region 125D has a doping concentration that is preferably higher than the doping concentration of source/drain regions 125A 1 and 125A-2, but may be equal or lower. The inventors found 3E15 Atoms/cm$^2$ worked better than 5E15 Atoms/cm$^2$ as a doping concentration for source/drain regions 125A-1 and 125A-2.

Referring to the right side of FIG. 3, bipolar transistor 100D is formed in a N-well 104D, and includes a P-base region 120D, a ZN+ emitter region 125D disposed in the P-base region 120D, and an N+ collector contact region 127D formed in N-well region 104D away from P-base region 120D. Note that N-wells 104C and 104D are formed simultaneously, and therefore have the same electrical characteristics (e.g., doping concentrations). Similarly, body region 120A of NVM device 100A and base region 120D of bipolar transistor 100D are formed simultaneously, and therefore have the same electrical characteristics (e.g., doping concentrations). Likewise, source/drain regions 125A-1 and 125A-2 of NVM device 100A and emitter region 125D of bipolar transistor 100D are formed simultaneously, and therefore have the same electrical characteristics (i.e., doping concentrations).

As indicated in FIG. 3, during normal operation each of the devices is connected to a different signal source or destination. For example, NVM device 100A receives a drain signal D1 on source/drain region 125A-1 by way of a suitable contact (not shown), and generates a source signal S1 on source/drain region 125-A2 whose voltage level is determined by the programmed/erased state of control gate 132A, which is capacitively coupled to region 120B (see FIG. 1), and is controlled as described in co-pending U.S. patent application Ser. No. 11/351,520, which is cited above. In contrast, CMOS FET 100C receives a drain signal D2 on source/drain region 127C-1, and generates a source signal S2 on source/drain region 127-C2 whose voltage level is determined by a gate control signal G applied to control gate 132C. Similarly, bipolar transistor 100D receives a drain collector signal C on collector region 127D and a base signal B on P-base region 120D, and generates an emitter signal E on emitter region 125 whose voltage level is determined by the base signal.

Figure 4:
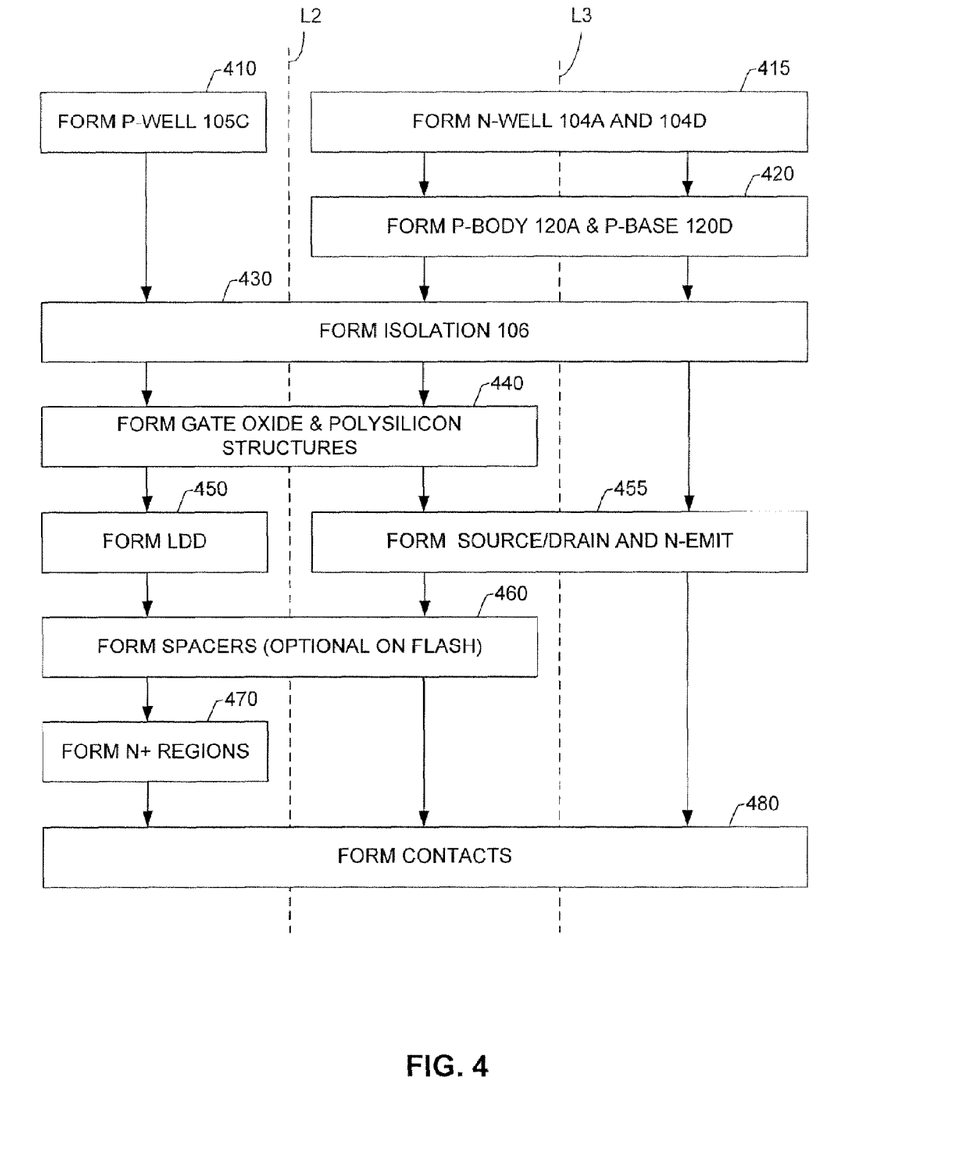
FIG. 4 is a flow diagram depicting the process steps associated with the production of the BiCMOS IC of FIG. 3 according to an embodiment of the present invention.

FIG. 4 is a flow diagram depicting a method for forming BiCMOS IC 100 (FIG. 3) according to another embodiment of the present invention, and FIGS. 5(A) to 5(H) are cross sectional side views depicting the structures formed by each of the process steps. The flow diagram of FIG. 4 is generally separated into three columns by dashed lines L2 and L3, with BiCMOS process steps associated with fabrication of CMOS FET 100C depicted to the left of line L2, process steps associated with the fabrication of NVM device 100A depicted to the between lines L2 and L3, and process steps associated with the fabrication of bipolar transistor 100d depicted to the right of line L3. Blocks that are solely located in one of the columns represent process steps that are solely used in the fabrication of that device (e.g., block 410 depicts a process step that is only used to produce N-channel CMOS FETs). In contrast, blocks that span two or more columns represent process steps that are used to produce structures associated with two or more of the devices (e.g., block 415 represents a process step utilized to produce portions of both NVM cell 100A and bipolar transistor 100D, and block 430 represents a process step utilized to produce portions of each of NVM cell 100A, CMOS FET 100C, and bipolar transistor 100D). It is again noted that the flow diagram of FIG. 4 is greatly simplified for descriptive purposes, and those skilled in the art that portions of the BiCMOS process flow (e.g., the formation of P-well regions for N-channel CMOS FETs) are omitted for brevity.

Figure 5A:
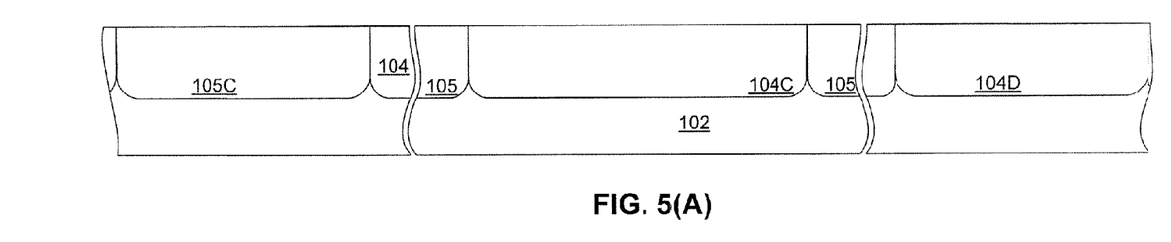
FIGS. 5(A), 5(B), 5(C), 5(D), 5(E), 5(F), 5(G), and 5(H) are cross-sectional side views showing the BiCMOS IC of FIG. 3 during various stages of fabrication according to the method depicted in FIG. 4.
Figure 5B:
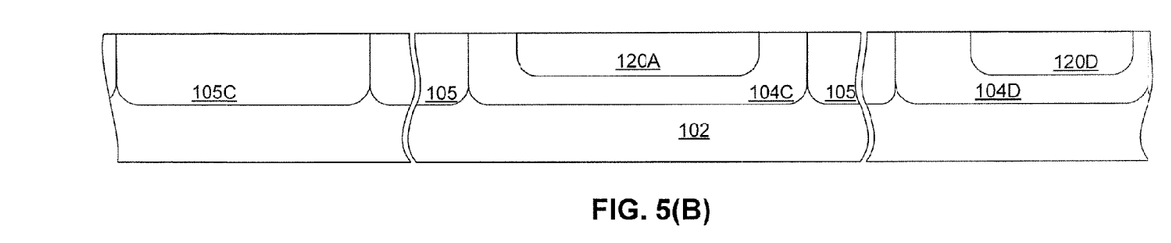
Figure 5C:
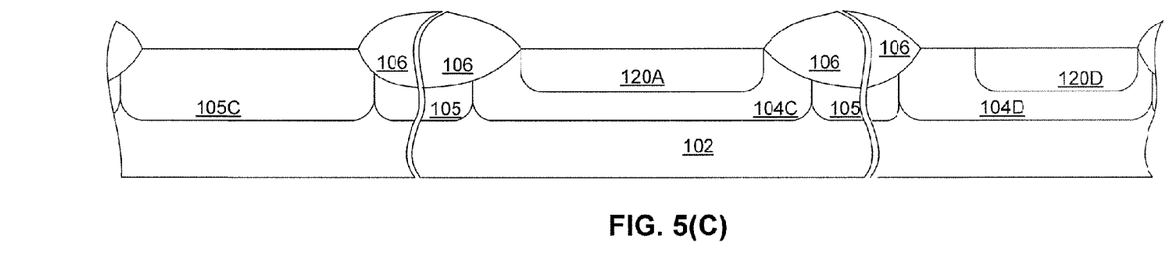
Figure 5D:
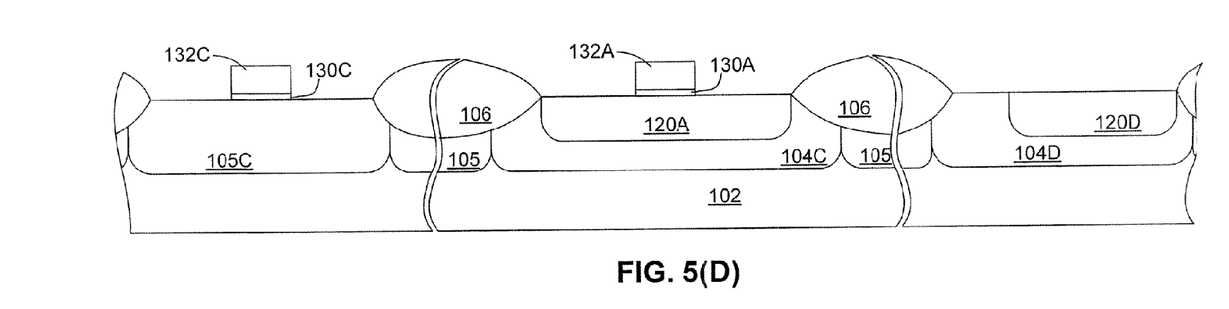
Figure 5E:
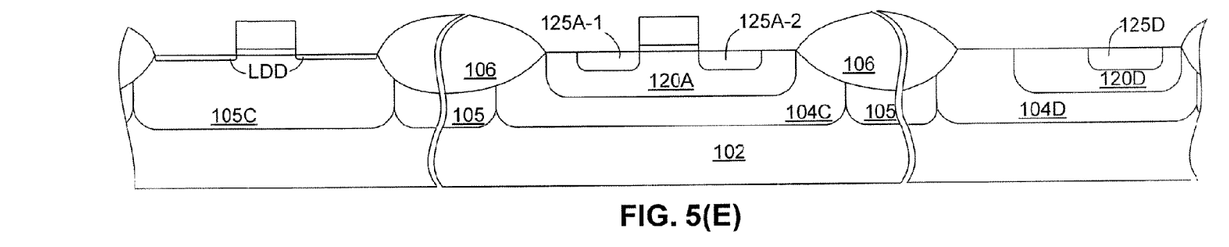
Figure 5F:
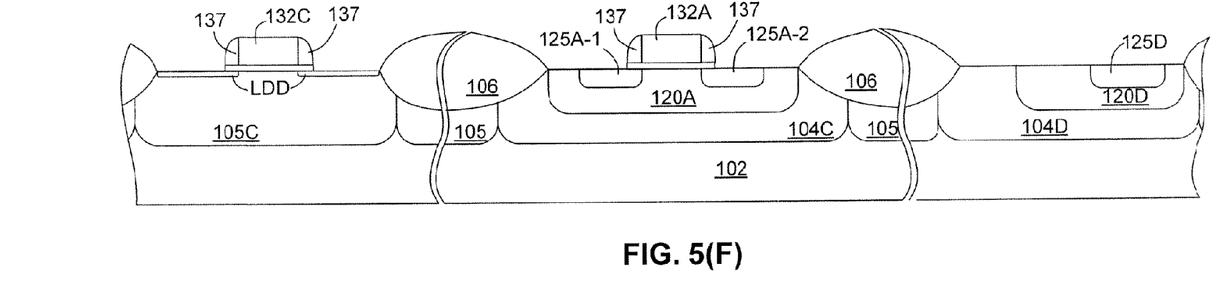
Figure 5G:
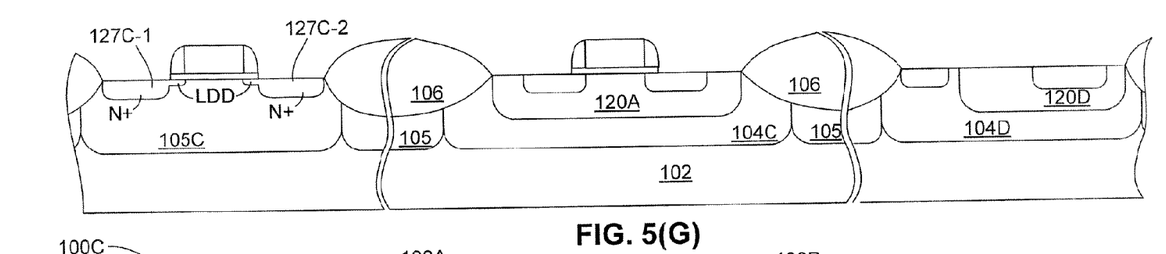
Figure 5H:
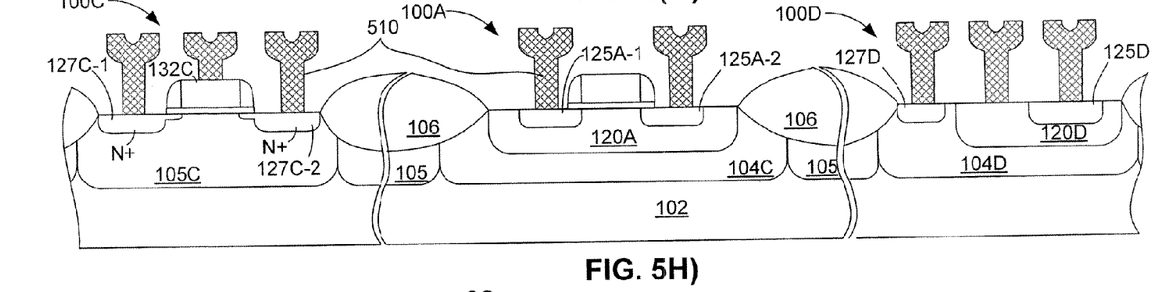

Referring to the top of FIG. 4 and FIG. 5(A), the BiCMOS process flow begins by forming P-wells and N-wells in the P-type substrate using known techniques. This process includes forming P-well 105C of CMOS FET 100C (block 410) and N-wells 104A and 104D of NVM device 100A and bipolar transistor 100D, respectively. FIG. 5(A) depicts substrate 102 after the N-wells and P-wells are formed. Next, the BiCMOS process flow includes simultaneously forming P-base (body) diffusion 120A of NVM device 100A and 120D of bipolar transistor 100D using known techniques (block 420; see also FIG. 5(B)). Field oxide regions 106 are then grown around and in all three devices (block 430; see FIG. 5(C)). A gate oxide layer and a polysilicon layer is then deposited and patterned according to known techniques to simultaneously form gate oxide structures 130A and 130C and control gates 132A and 132C of NVM device 100A and CMOS FET 100C, respectively (block 440; FIG. 5(D)). LDD regions are then formed in CMOS FET 100C using known techniques (block 450), and source/drain regions 125A-1 and 125A-2 and emitter region 125D are formed in NVM cell 100A and bipolar transistor 100D (block 455; see FIG. 5(E)). Sidewall spacers 137 are then formed on the side edges of control gates 132A and 132C (block 460; FIG. 5(F)). Heavily-doped (N+) portions of source/drain regions 127C-1 and 127C-2 and collector contact region 127D are then formed using known techniques (block 470; FIG. 5(G)). Finally, metal contacts 510 are formed to provide access to source/drain regions 125A-1 and 125A-2 of NVM cell 100A, source/drain regions 127C-1 and 127C-2 and control gate 132C of CMOS FET 100C, and to base 120D, emitter 125D and collector contact 127D of bipolar transistor 100D using known metallization techniques (block 480; see FIG. 5(H))

Figure 6:
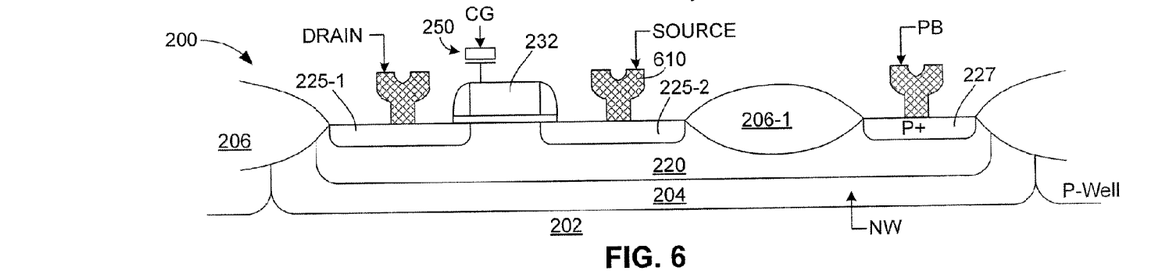
FIG. 6 is a cross-sectional side view showing a NVM device according to another embodiment of the present invention.

FIG. 6 is a cross-sectional side view showing an NVM device 200 according to an alternative embodiment of the present invention. NVM device 200 is formed on a P-type substrate 202 and includes an N-well 204 and P-body region that are formed substantially as described above. However, NVM device 200 also includes a base contact structure including a P+ diffusion 227 that is formed in base region 220 and separated from source/drain regions 225-1 and 225-2 by an oxide region 206-1. P+ diffusion region 227 has substantially the same doping concentration as the N+ doping regions 127 of BiCMOS IC 100 (described above), and are formed simultaneously with the P+ regions of p-channel CMOS FETs. Note that a separate contact to N-well 204 may be achieved with a similar diffusion/contact. Metal contacts 610 are provided to each of source/drain regions 225-1 and 225-2, and also to P+ diffusion region 227. A coupling capacitor 250 is connected to control gate 232 in a manner described above with reference to NVM device 100A.

In one embodiment, the exemplary (pulse) voltages provided in Table 1 (below) are applied to program or erase memory cell 200.

TABLE 1

| operation | DRAIN | SOURCE | PB (body) | CG (gate) | N-Well | Gate Current Method |
|---|---|---|---|---|---|---|
| program | 5.5 | 0 | 0 | 10 | 10 | Channel hot electron |
| program | −5 | −5 | −5 | 10 | 10 | Fowler-Nordheim D, S, B |
| program | | | −5 | 10 | 10 | Fowler-Nordheim Body |
| erase | | 5 | 5 | −10 | 10 | Fowler-Nordheim Source |
| erase | | | 10 | −5 | 10 | Fowler-Nordheim Body |
| erase | | | 5 | −10 | 10 | Fowler-Nordheim Body |

Although the present invention has been described with respect to certain specific embodiments, it will be clear to those skilled in the art that the inventive features of the present invention are applicable to other embodiments as well, all of which are intended to fall within the scope of the present invention. For example, although positive and negative voltages are mentioned in the examples with a grounded substrate, one skilled in the art would know that these voltages could be substituted for other voltages that provide similar potential differences.

The invention claimed is:

1. A BiCMOS integrated circuit (IC) comprising:
   a substrate of a first conductivity type, the substrate having a first doping concentration;
   a first well region of a second conductivity type disposed in the substrate and having a second doping concentration;
   a first body region of the first conductivity type disposed in the first well region, the first body region having a third doping concentration that is at least five times higher than the second doping concentration;
   a gate dielectric disposed on the first body region;
   a control gate disposed on the gate dielectric;
   source and drain regions of the second conductivity type disposed in the first body region on opposite sides of the control gate, the source and drain regions having a fourth doping concentration that is higher than the third doping concentration;
   a second body region disposed in the first well region of the first conductivity type disposed and having the third doping concentration; and
   a plate portion disposed over the second body region and being connected to the control gate,
   wherein the plate portion and second body region form a coupling capacitor.

2. The BiCMOS IC according to claim 1, wherein the fourth doping concentration of the body region is at least ten times higher than the second doping concentration.

3. The BiCMOS IC according to claim 1, wherein the source and drain regions do not include lightly doped drain structures.

4. The BiCMOS IC according to claim 1, wherein both a portion of each of the source and drain regions located under a side edge of the control gate and a second portion of said each source and drain regions located away from the side edge of the control gate have the fourth doping concentration.

5. The BiCMOS IC according to claim 1, wherein the control gate and the plate portion comprise an integral polycrystalline silicon structure.

6. The BICMOS IC according to claim 1, further comprising a bipolar transistor comprising:
  a third well region of the second conductivity type disposed in the substrate and has the first doping concentration;
  a base region of the first conductivity type disposed in the third well region, the base region having the third doping concentration; and
  an emitter region of the second conductivity type disposed in the base region, the emitter region having the fourth doping concentration.

7. The BiCMOS IC according to claim 6, wherein the bipolar transistor further comprises a collector contact region formed in the third well region and spaced from the base region, wherein the collector contact region has a sixth doping concentration that is less than the fourth doping concentration.

8. A BiCMOS integrated circuit (IC) comprising:
  a substrate of a first conductivity type, the substrate having a first doping concentration;
  a first well region of a second conductivity type disposed in the substrate and having a second doping concentration;
  a first body region of the first conductivity type disposed in the first well region, the first body region having a third doping concentration that is at least five times higher than the second doping concentration;
  a gate dielectric disposed on the first body region;
  a control gate disposed on the gate dielectric;
  source and drain regions of the second conductivity type disposed in the first body region on opposite sides of the control gate, the source and drain regions having a fourth doping concentration that is higher than the third doping concentration;
  a CMOS field-effect transistor (FET) comprising:
  a second well region of the first conductivity type disposed in the substrate and having a fifth doping concentration that is greater than the first doping concentration;
  a second gate dielectric disposed on the second well region;
  a second control gate disposed on the second gate dielectric; and
  second source and drain regions of the second conductivity type disposed in the second well region on opposite sides of the control gate, each of the source and drain regions having a lightly-doped drain (LDD) region located adjacent to the second control gate, and a heavily-doped region located away from the second control gate, wherein the heavily doped regions of the second source and drain regions have a sixth doping concentration that is less than the fourth doping concentration.

9. The BiCMOS IC according to claim 8,
  wherein the second gate dielectric of the CMOS FET and the first gate dielectric have a substantially identical thickness and composition, and
  wherein the second control gate and the first control gate have a substantially identical thickness and conductivity.

10. A BiCMOS integrated circuit (IC) comprising:
  a substrate of a first conductivity type, the substrate having a first doping concentration;
  a non-volatile memory (NVM) device including:
    a first well region of a second conductivity type disposed in the substrate;
    a first body region of the first conductivity type disposed over the first well region;
    a gate dielectric disposed on the first body region;
    a first control gate disposed on the gate dielectric; and
    first source and drain regions of the second conductivity type disposed in the first body region on opposite sides of the first control gate;
    a second body region disposed in the first well region of the first conductivity type; and
    a plate portion disposed over the second body region and being connected to the control gate, wherein the plate portion and second body region form a coupling capacitor, and
  a bipolar transistor including:
    a second well region of the second conductivity type disposed in the substrate;
    a base region of the first conductivity type disposed in the second well region; and
    an emitter region of the second conductivity type disposed in the base region,
  wherein the first body region and the second body region of the NVM device and the base region of the bipolar transistor have a substantially identical doping concentration.

11. The BiCMOS IC according to claim 10, wherein the first source and drain regions of the NVM device and the emitter region of the bipolar transistor have a substantially identical doping concentration.

12. The BiCMOS IC according to claim 10, further comprising a CMOS transistor CMOS field-effect transistor (FET), the CMOS FET including:
  a third well region of the first conductivity type disposed in the substrate;
  a second control gate disposed over the third well region; and
  second source and drain regions of the second conductivity type disposed in the third well region on opposite sides of the control gate,
  wherein the first control gate of the NVM device and the second control gate of the CMOS FET have a substantially identical conductivity.

13. The BiCMOS IC according to claim 12,
  wherein the NVM device further includes a first gate dielectric disposed between the first control gate and the substrate,
  wherein the CMOS FET further includes a second gate dielectric disposed between the second control gate and the substrate, and
  wherein the second gate dielectric of the CMOS FET and the first gate dielectric have a substantially identical thickness and composition.

* * * * *